United States Patent
Chao

(10) Patent No.: US 12,334,949 B2
(45) Date of Patent: Jun. 17, 2025

(54) SINGLE-END INPUT CONFIGURABLE DIFFERENTIAL SAR ANALOG-TO-DIGITAL CONVERTER

(71) Applicant: Yuan-Ju Chao, Cupertino, CA (US)

(72) Inventor: Yuan-Ju Chao, Cupertino, CA (US)

(73) Assignee: IPSmart Inc., Hsinchu (TW)

( * ) Notice: Subject to any disclaimer, the term of this patent is extended or adjusted under 35 U.S.C. 154(b) by 179 days.

(21) Appl. No.: 18/244,288

(22) Filed: Sep. 10, 2023

(65) Prior Publication Data

US 2025/0088198 A1    Mar. 13, 2025

(51) Int. Cl.
*H03M 1/38*    (2006.01)
*H03M 1/00*    (2006.01)
*H03M 1/46*    (2006.01)

(52) U.S. Cl.
CPC ............. *H03M 1/38* (2013.01); *H03M 1/002* (2013.01); *H03M 1/462* (2013.01); *H03M 1/466* (2013.01); *H03M 1/468* (2013.01)

(58) Field of Classification Search
CPC ........ H03M 1/38; H03M 1/002; H03M 1/462; H03M 1/466; H03M 1/468
See application file for complete search history.

(56) References Cited

U.S. PATENT DOCUMENTS 6,864,821 B2 *  3/2005  Yang ............... H03M 1/682
                                                 341/155
8,717,221 B2 *  5/2014  Jeon ................ H03M 1/38
                                                 341/172

* cited by examiner

*Primary Examiner* — Khai M Nguyen
(74) *Attorney, Agent, or Firm* — PatentPC PowerPatent; Bao Tran

(57) ABSTRACT

A single-end input configurable Successive Approximation Register Analog-to-Digital Converter (SARADC) allows for the input configuration as single-ended or differential inputs without adding extra circuitry. In both configurations, the ADC maintains the same LSB voltage and output code range. Furthermore, when configured as a single-ended input, power consumption is further reduced.

20 Claims, 7 Drawing Sheets

SINGLE-END INPUT CONFIGURABLE DIFFERENTIAL SAR ANALOG-TO-DIGITAL CONVERTER

BACKGROUND

FIG. 1 illustrates the functional diagram of an N-bit Successive Approximation Register Analog-Digital Converter (SAR ADC), comprising a Track/Hold circuit, Comparator, N-bit DAC and Binary Search Logic. The analog input voltage, $V_{IN}$, is sampled by Track/Hold circuit. N-bit DAC is initially set to midscale (100 . . . 00), resulting in the DAC output, $V_{DAC}$, being equal to $V_R/2$, where $V_R$ is the reference voltage. The Comparator compares $V_{IN}$ and $V_{DAC}$, and its outcome determines the next operation. When $V_{IN}$ is greater than $V_{DAC}$, the comparator output is a logic high signal and the most significant bit (MSB) of the N-bit register remains at 1. Conversely, if $V_{IN}$ is less than $V_{DAC}$, the comparator output is a logic low signal, and the MSB is cleared to logic 0. Next the DAC output is set to $V_R/4$. This binary-search process continues onto the next lower bit, and the ADC conversion is completed when the least significant bit (LSB) output is obtained.

FIG. 2 depicts the implementation of a 12-bit SARADC with a 12-bit binary weighted capacitive DAC. Both Track/Hold and DAC functions are fulfilled using a capacitive DAC. Each capacitor can be connected to input INP/INN, reference voltage $V_R$, or ground controlled by associated switches. The sampling phase begins, followed by the binary search phase. In the sample phase, all switches are connected to the input INP/INN, allowing the input voltage to be effectively sampled and stored on all the capacitors. Common-mode switches 201/202 are coupled to the common-mode voltage, VCM. As the first step of the binary-search process begins, the MSB capacitor C11 is connected to reference voltage $V_R$ and the rest of capacitors C10~C0 are grounded. This drives the voltage of comparator inputs by an amount of $0.5V_R$ owing to the principle of charge redistribution. The comparator strobes, and the MSB output is generated. As the binary-search process continues, the next smaller capacitor C10 is connected to $V_R$. The conversion process is complete once all the DAC capacitors are exercised.

At the end of the $1^{st}$ binary search, wherein the MSB capacitor C11 is coupled to $V_R$ and the rest of capacitors C10~C0 are grounded, the voltage of comparator inputs VP/VN can be described by the following equations:

$$VP = VCM + \frac{(VR - INP)}{2} + \frac{(0 - INP)}{2} \quad \text{Eq. (1)}$$

$$VN = VCM + \frac{(0 - INN)}{2} + \frac{(VR - INN)}{2} \quad \text{Eq. (2)}$$

The difference and the common-mode voltage of comparator inputs VP/VN can be derived from equation (1) and (2) and described as follows:

$$VP - VN = -(INP - INN) \quad \text{Eq. (3)}$$

$$\frac{VP + VN}{2} =$$
$$VCM + \frac{VR}{2} - \frac{(INP + INN)}{2} = VCM + VCM\_REF - VCM\_INPUT \quad \text{Eq. (4)}$$

Equation (3) indicates that the comparator input voltage is actually the difference of input INP/INN. Equation (4) indicates that the commo-mode voltage is VCM when reference common-mode voltage VCM_REF equals input common-mode voltage VCM_INPUT.

Most data acquisition applications require ADC to support both single-ended input and differential inputs. There are two conventional methods to enable differential SARADC to support single-ended input. FIG. 3 illustrates the single-end input configurations of a conventional 12-bit SARADC, wherein single-end input is on INP and another input INN is coupled to common-mode voltage, VCM. Similar to the previous derivation, the voltage on comparator input VP/VN when MSB capacitor C11 and other capacitors C10~C10 are coupled to $V_R$ and ground is expressed as:

$$VP = VCM + \frac{(VR - INP)}{2} + \frac{(0 - INP)}{2} \quad \text{Eq. (5)}$$

$$VN = VCM + \frac{(0 - VCM)}{2} + \frac{(VR - VCM)}{2} \quad \text{Eq. (6)}$$

The difference and the common-mode voltage of comparator inputs VP/VN can be derived from equation (5) and (6) and described as:

$$VP - VN = -(INP - VCM) \quad \text{Eq. (7)}$$

$$\frac{VP + VN}{2} = VCM + \frac{VR}{2} - \frac{(INP + VCM)}{2} \quad \text{Eq. (8)}$$

Equation (7) indicates that the comparator input voltage is the difference of single-end input INP and VCM. Equation (8) indicates that the common-mode voltage is a function of VCM, reference voltage $V_R$ and single-end input INP.

The drawback of this configuration becomes evident when examining equation (7) and (8). First the input range is reduced by half compared to equation (3), hence the LSB voltage is half of the LSB voltage in differential mode. Secondly, the comparator common-mode voltage is changing with respect to reference voltage $V_R$ and input INP during binary search process, whereas equation (4) shows that the common-mode voltage of the comparator inputs is a constant voltage.

FIG. 4 illustrates another single-end configuration using an amplifier, wherein an amplifier 401 is inserted to convert single-end input INP to differential inputs INP2/INN2. This method avoids the drawbacks mentioned in the previous configuration; however, the addition of amplifier 401 is costly in power consumption, performance, and silicon area.

SUMMARY

In one aspect, a single-end input configurable Successive Approximation Register Analog-to-Digital converter (SARADC) includes input sampling switches, capacitive DACs, a comparator, binary search logic, and a single-end P/N configure circuit. The capacitive DAC and common-mode voltage switches are controlled by the single-end P/N configure circuit. Depending on whether the input is differential, P single-ended or N single-ended, the single-end P/N configure circuit is connected to the associated DAC switches and common-mode switches differently. This results in maintaining the same LSB voltage and output code range without the need for additional circuitry and power consumption.

In another aspect, a method of digitizing an analog input includes configuring a differential Successive Approximation Register Analog-to-Digital (SARADC) for single-ended input with an LSB voltage; maintaining an output code range constant, wherein the SARADC includes input switches, capacitive Digital-to-Analog (DAC), a comparator, binary search logic and single-end P/N configure circuit; the binary search logic is coupled to single-end P/N configure circuit which controls DAC switches and common-mode switches.

In implementations, each conversion begins with input sampling phase followed by a binary search phase, and during an input sampling phase, the input voltage is captured onto sampling capacitors, and during a binary search phase, capacitive DAC switches are sequentially coupled to reference or ground based on the outputs of the comparator and single-end P/N configure circuit, wherein a conversion is complete when all DAC capacitors complete the binary search phase. The capacitive DAC switches and common-mode voltage (VCM) switches are controlled by the single-end P/N (positive/negative) configure circuit coupled to the reference, ground or common-mode voltage (VCM) and selectable as a single-end input mode or a differential inputs mode. A selection circuit with three configuration modes including a differential inputs mode, an INP single-end input mode, and an INN single-end input mode, wherein for the differential inputs mode, both DACs and common-mode switches are enabled, wherein for the INN single-end input configuration, DAC_P and the corresponding capacitors are disabled, and wherein for the INP single-end input configuration, DAC_N and the associated capacitors are disabled. For differential inputs mode, both DACs are enabled, at the end of the first binary search operation, the comparator input VP/VN voltage is expressed as:

$$VP = VCM + \frac{(VR - INP)}{2} + \frac{(0 - INP)}{2}$$

$$VN = VCM + \frac{(0 - INN)}{2} + \frac{(VR - INN)}{2}$$

wherein VCM is common-mode voltage, $V_R$ is the reference voltage, INP/INN are differential input voltages.
For the INP single-end input mode, a DAC_N is disabled, at the end of the first binary search operation, and the comparator input VP/VN voltage is expressed as:

$$VP = VCM + \frac{(VR - INP)}{2} + \frac{(0 - INP)}{2}$$

$$VN = VCM$$

wherein VCM is common-mode voltage, $V_R$ is the reference voltage, INP is single-end input voltage.
For the INN single-end input mode, wherein DAC_P is disabled, at the end of the first binary search operation, the comparator input VP/VN voltage is expressed as:

$$VP = VCM$$

$$VN = VCM + \frac{(VR - INN)}{2} + \frac{(0 - INN)}{2}$$

wherein VCM is common-mode voltage, $V_R$ is the reference voltage, INN is single-end input voltage.

The LSB voltage and the output code range remain consistent whether in differential input mode, INP single-end input mode, or INN single-end input mode. The input common-mode variation of the comparator during binary search phase is reduced when using single-ended input configuration. For the single-end input mode, one DAC is disabled to reduce consumption of SARADC.

Advantages of the system may include one or more of the following: SARADC is configured with respect to the input configuration, either in differential mode, P single-ended or N single-ended mode. When operated in single-ended mode, the LSB voltage and output code range is maintained as the same as in differential mode. Furthermore, power consumption is reduced to achieve better power efficiency. The configuration avoids LSB voltage reduction issue and mitigates the varying comparator's common-mode problem. The configuration further reduces power consumption without adding extra circuitry when used in single-end mode.

DETAILED DESCRIPTION

Figure 1:
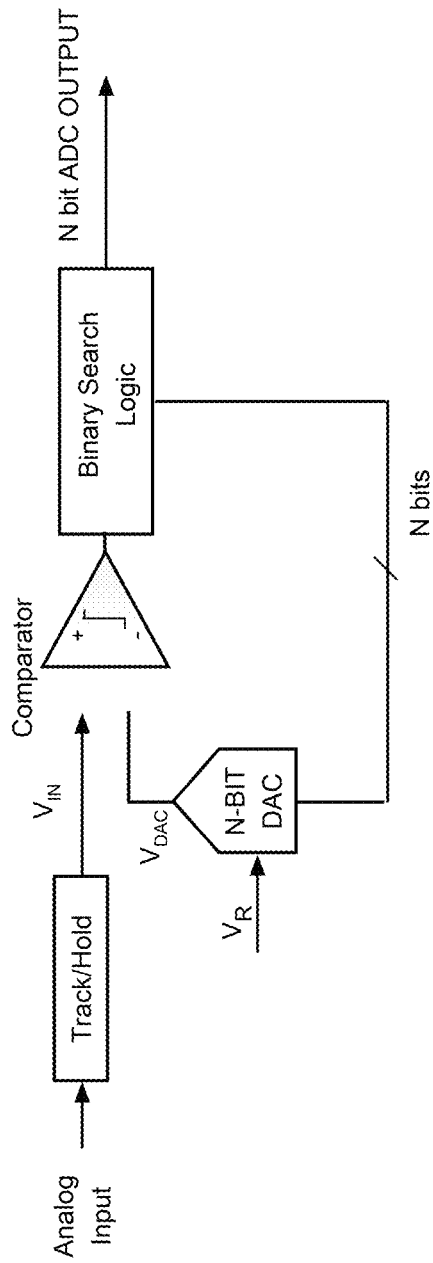
FIG. 1 illustrates the functional diagram of conventional N-bit SAR ADC.

The present invention will be described with respect to specific embodiments and reference to specific drawings. However, the scope of the invention is not limited to these specifics but rather defined by the claims. The described drawings are schematic in nature and do not impose limitations. In the drawings, the size of some of the elements may be exaggerated and not drawn on scale for illustrative purposes.

The terms 'first', 'second', 'third' and the similar terms in the description and the claims are used to distinguish between similar elements and do not necessarily imply a sequential or chronological order. It is to be understood that the terms so used are interchangeable under appropriate circumstances and that the embodiments of the invention described herein are capable of operation in other sequences than described or illustrated herein.

Furthermore, it should be noted that the term "comprising", as used in the claims, should not be interpreted as limited to the elements listed subsequently; it does not exclude the inclusion of other elements or steps. Therefore, the scope of the expression "a device comprising means A and B" should not be limited to devices consisting solely of components A and B. This means that there is pathway connecting an output of A to an input B, which may involve other devices or means.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 5:
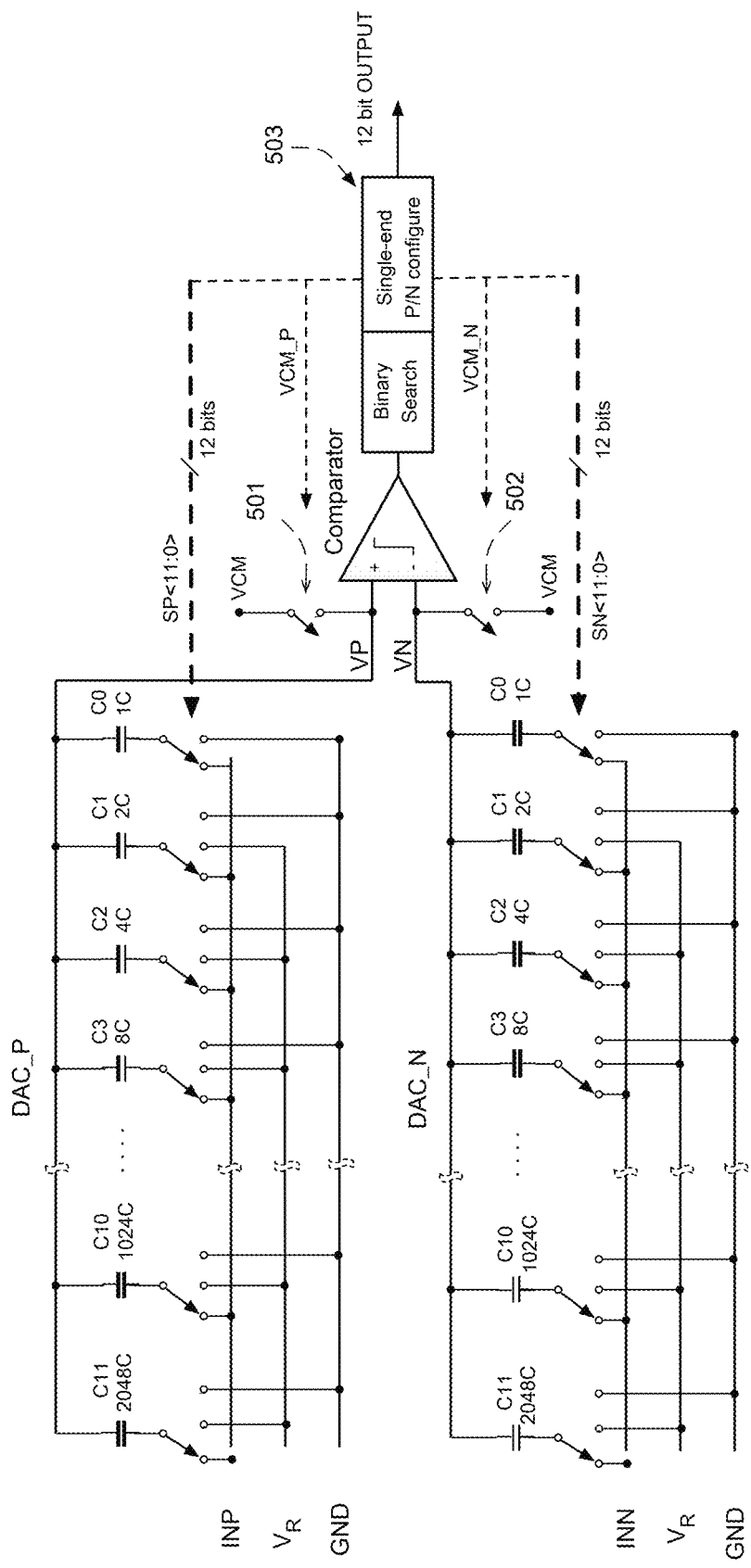
FIG. 5 illustrates the proposed single-end configurable differential SARADC.

FIG. 5 illustrates the proposed single-end configurable SARADC. The Single-end P/N configure circuit 503 is inserted after the Binary search logic to control the DAC switches and common-mode voltage switches 501/502. SP<11:0> and SN<11:0> are coupled to DAC_P and DAC_N switches respectively. VCM_P and VCM_N are coupled to VCM switches 501 and 502.

Figure 2:
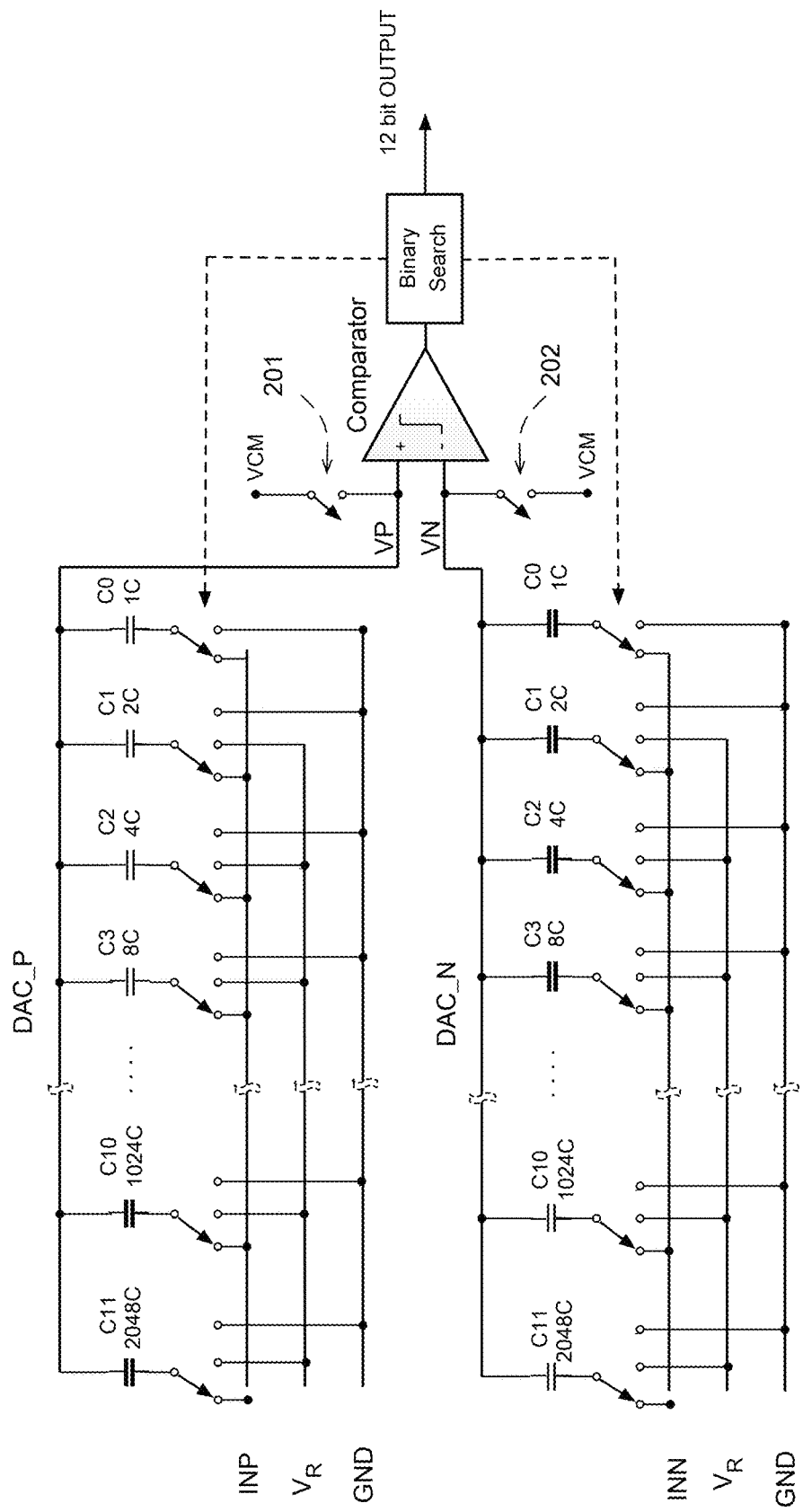
FIG. 2 is the implementation of 12-bit SARADC with 12-bit binary capacitive DAC.
Figure 3:
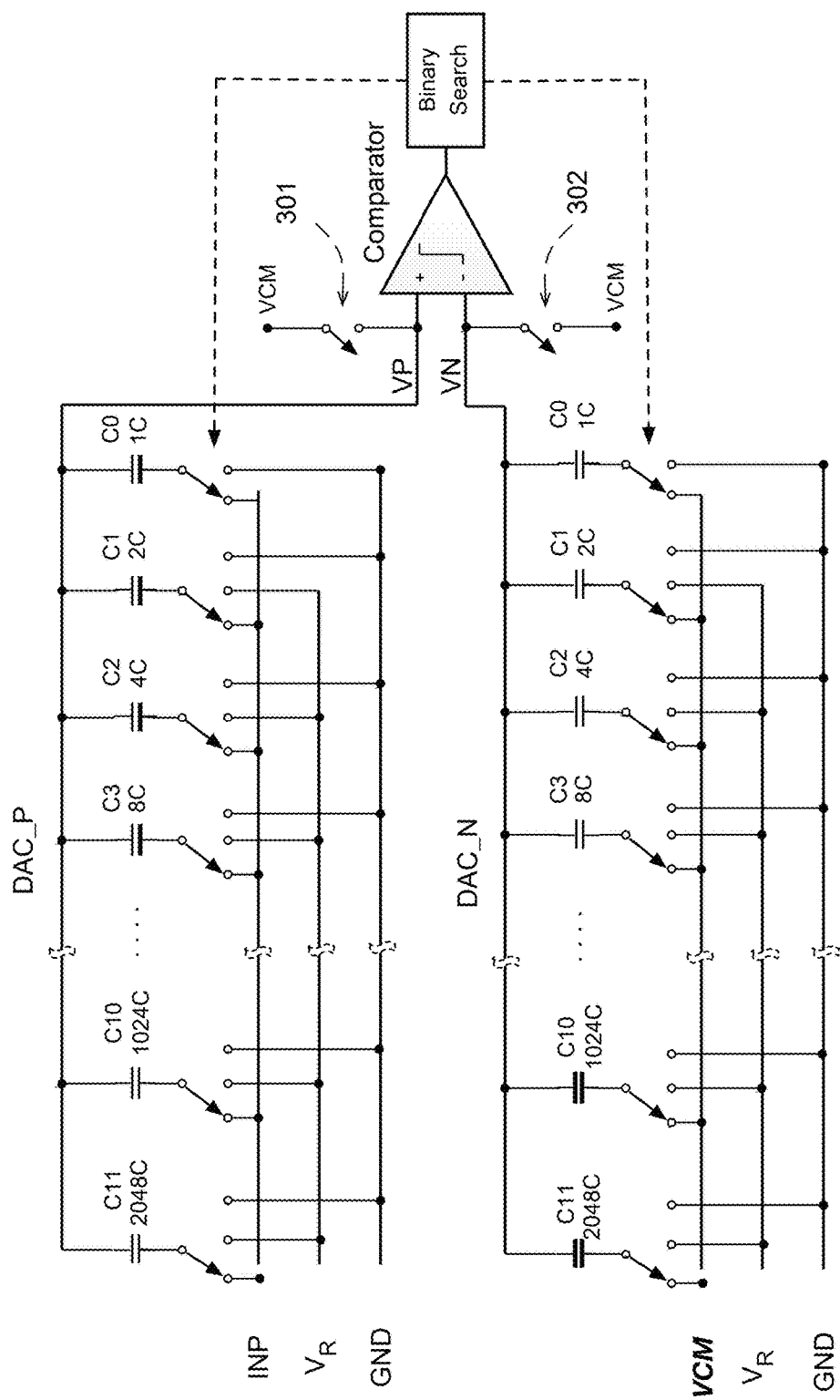
FIG. 3 illustrates the single-end input configuration of conventional 12-bit SARADC.
Figure 4:
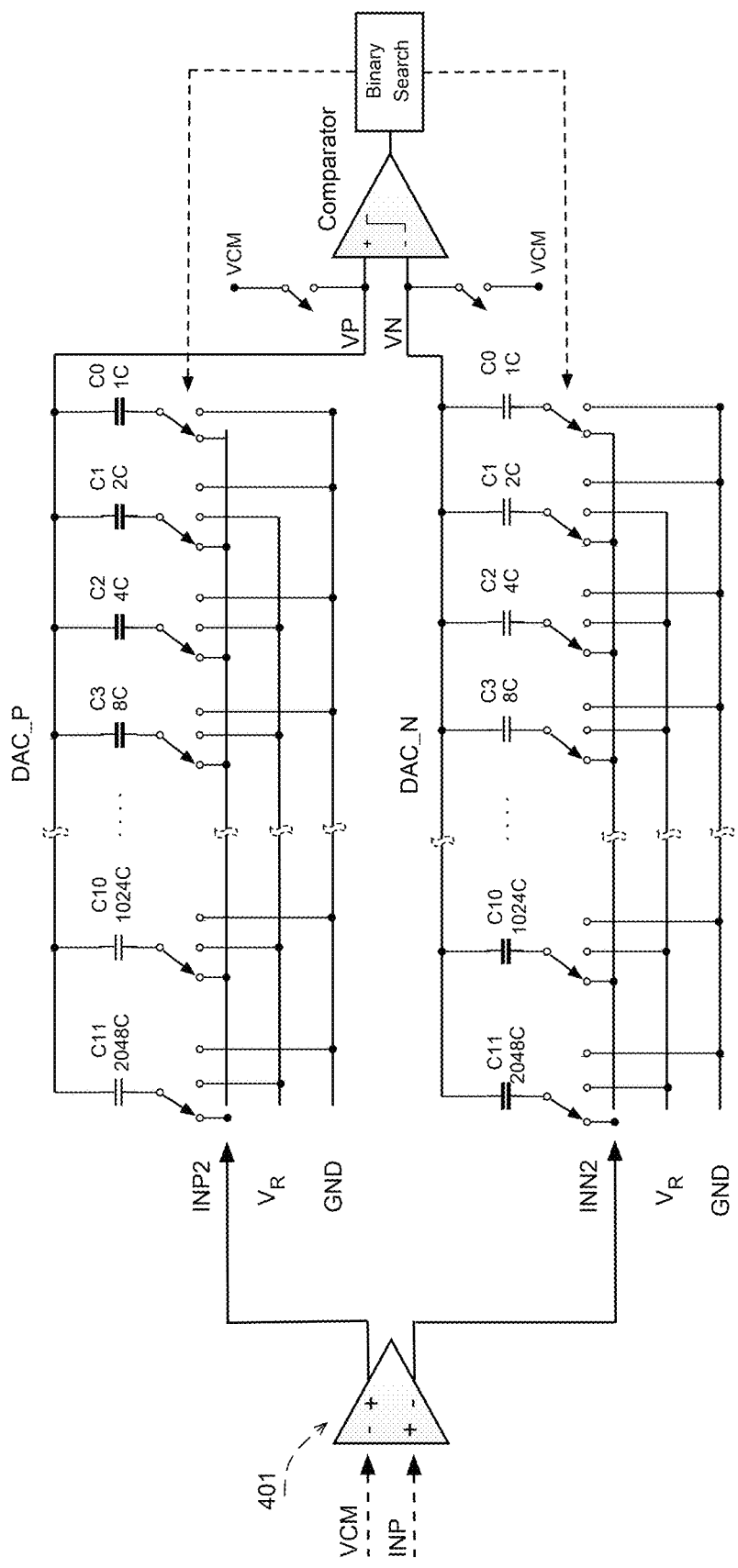
FIG. 4 illustrates another single-end input configuration using an amplifier.

In the differential input mode, the configuration is the same as shown in FIG. 2. The voltage of comparator inputs VP/VN is identical to that in equation (1) and equation (2). Additionally, the difference and the common-mode voltage of comparator inputs VP/VN are consistent with equation (3) and equation (4).

Figure 6:
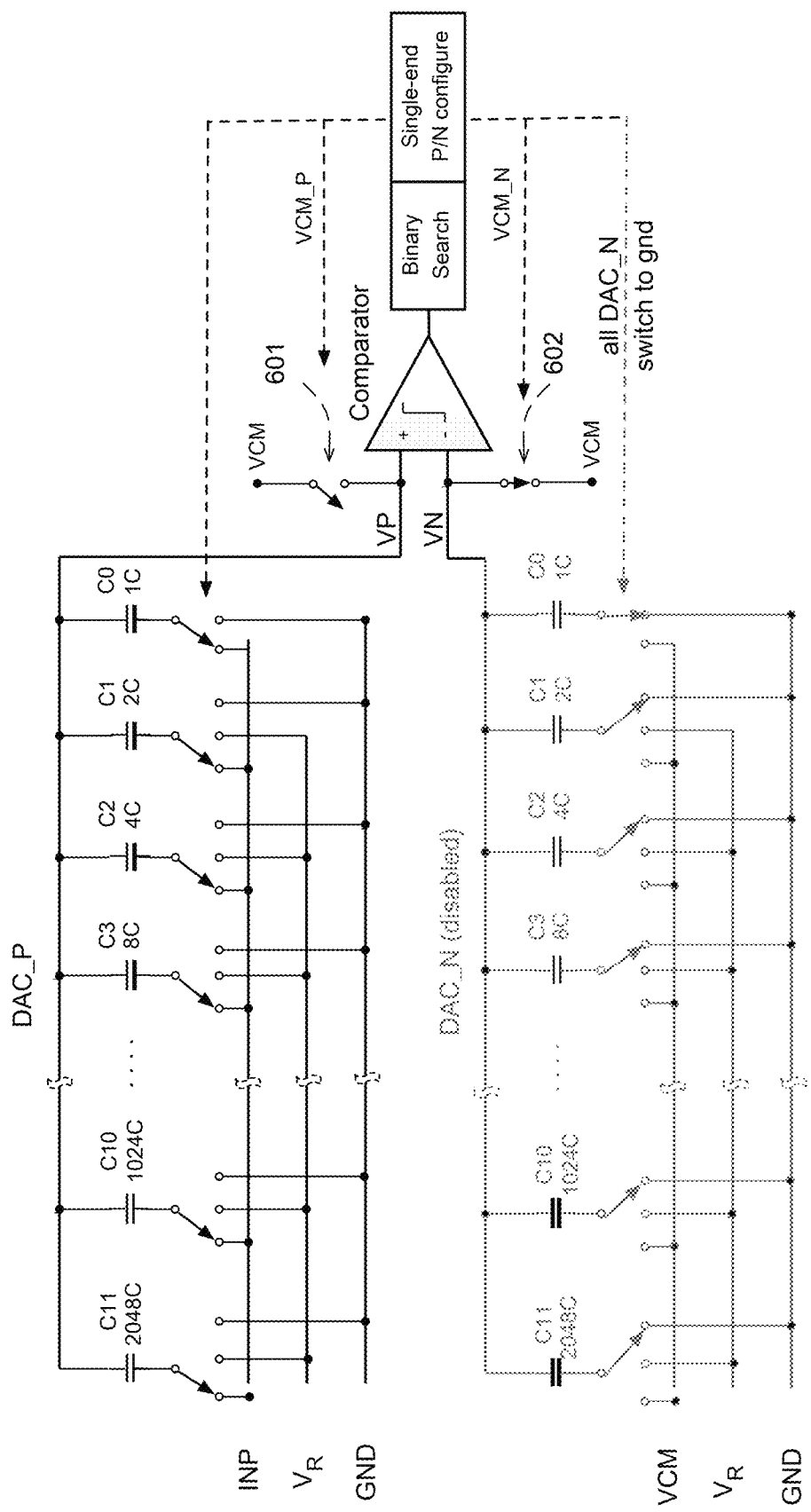
FIG. 6 illustrates the single-end INP selected configuration of FIG. 5.

FIG. 6. illustrates the INP single-end configuration, where INP serves as the single-ended input and the other input is coupled to common-mode voltage VCM. All switches associated with DAC_N are connected to ground, effectively disabling DAC_N. Furthermore, VCM_N is consistently set to logic high, ensuring that switch 602 is closed and VN equals VCM. The voltage on the comparator input VP/VN, when the MSB capacitor C11 is coupled to $V_R$ while the remaining capacitors C10~C10 are grounded, can be expressed as follows:

$$VP = VCM + \frac{(VR - INP)}{2} + \frac{(0 - INP)}{2} \quad \text{Eq. (9)}$$

$$VN = VCM \quad \text{Eq. (10)}$$

The difference and the common0mode of comparator inputs VP/VN can be derived from equation (9) and (10) and described as:

$$VP - VN = -\left(INP - \frac{VR}{2}\right) \quad \text{Eq. (11)}$$

$$\frac{VP + VN}{2} = VCM + \frac{VR}{4} - \frac{INP}{2} \quad \text{Eq. (12)}$$

Equation (11) indicates that the comparator input represents the difference of single-ended input INP and half of the reference $V_R$, precisely reflecting the first binary search function. Equation (12) indicates that the common-mode voltage is a function of VCM, reference voltage $V_R$ and single-end input INP. The voltage variation during binary search process is smaller when compared to equation (8).

Figure 7:
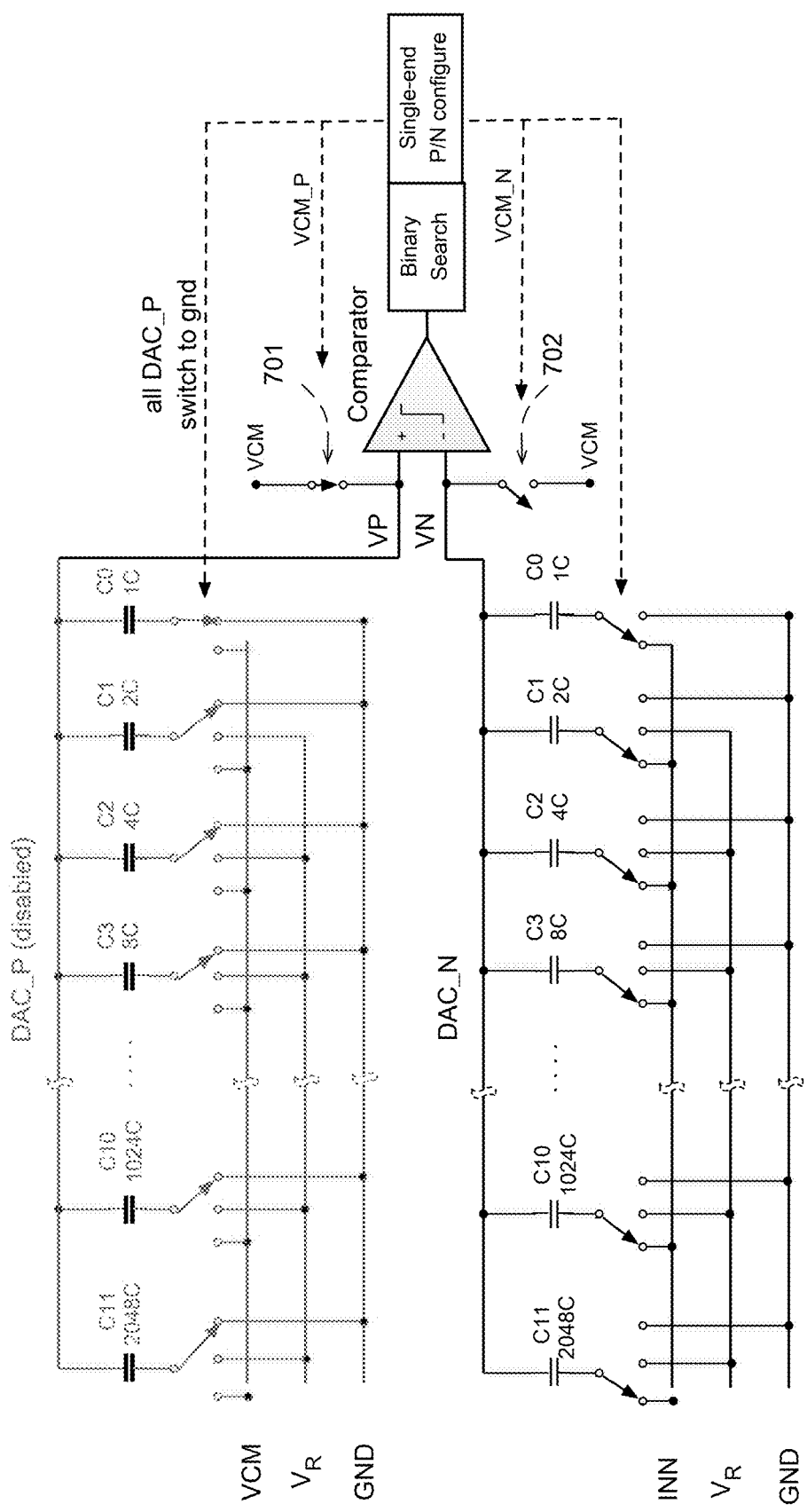
FIG. 7 illustrates the single-end INN selected configuration of FIG. 5.

FIG. 7. illustrates the INN single-end configuration, where INN serves the single-ended input and the other input is coupled to the common-mode voltage VCM. All switches associated with DAC_P are connected to ground, effectively disabling DAC_P. Furthermore, VCM_P is consistently set to logic high, ensuring that switch 701 is closed, and VN equals VCM. The voltage on the comparator input VP/VN, when the MSB capacitor C11 is coupled to $V_R$ while remaining capacitors C10~C10 are grounded, can be expressed as follows:

$$VP = VCM \quad \text{Eq. (13)}$$

$$VN = VCM + \frac{(VR - INN)}{2} + \frac{(0 - INN)}{2} \quad \text{Eq. (14)}$$

The difference and the common-mode voltage of comparator inputs VP/VN can be derived from equation (13) and (14) and described as:

$$VP - VN = -\left(INN - \frac{VR}{2}\right) \quad \text{Eq. (15)}$$

$$\frac{VP + VN}{2} = VCM + \frac{VR}{4} - \frac{INN}{2} \quad \text{Eq. (16)}$$

Equation (15) indicates that the comparator input represents the difference between the single-ended input INN and half of the reference $V_R$, accurately reflecting the first binary search function. Equation (16) indicates that the common-mode voltage is a function of VCM, reference voltage $V_R$ and single end input INP. The voltage variation during binary search process is smaller when compared to equation (8).

In the differential input mode, the ADC input full scale and reference are $2V_R$ and $2V_R$ respectively. However, in the single-end input mode, the ADC input full scale and reference are both $V_R$, as half of the DAC is disabled. This configuration results in a constant LSB voltage and a consistent output code range. Since half of DAC is disabled, power consumption is reduced during single-end input configuration. Additionally, the common-mode voltage variation of the comparator during the binary search process is reduced compared to conventional approaches.

The single-end P/N configure circuit controls the DAC and VCM switches specifically, ensuring that LSB voltage and output code range are consistent over differential mode or single-ended mode.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices.

Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. The specifications and drawings should therefore be considered in an illustrative rather than in a restrictive sense. In the claims, any reference signs placed between parentheses shall not be interpreted as limiting the claim. The term 'comprising' does not exclude the presence of other elements or steps than those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same principle applies to the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

A more complete appreciation of the present invention and its improvements can be obtained by reference to the accompanying drawings, which are briefly summarized below, to the following detailed description of illustrative embodiments of the invention, and to the appended claims.

What is claimed is:

1. A single-end input configurable differential SAR Analog-to-Digital converter (ADC) comprising:
    two capacitive DACs and associated switches;
    a comparator coupled to the two capacitive DACs;
    a binary search logic coupled to a comparator output; and
    a single-end P/N configure circuit coupled to the binary search logic, wherein the comparator output is coupled to the binary search logic, and the binary search logic is connected to the single-end P/N configure circuit; the outputs of the single-end P/N configure circuit are connected to the associated switches of the capacitive DACs and a common-mode voltage.

2. The converter of claim 1, wherein each conversion begins with input sampling phase followed by a binary search phase, and during an input sampling phase, the input voltage is captured onto sampling capacitors, and during a binary search phase, capacitive DAC switches are sequentially coupled to reference or ground based on the outputs of the comparator and single-end P/N configure circuit, wherein a conversion is complete when all DAC capacitors complete the binary search phase.

3. The converter of claim 1, wherein the capacitive DAC switches and common-mode voltage (VCM) switches are controlled by the single-end P/N configure circuit coupled to the reference, ground or common-mode voltage (VCM) and selectable as a single-end input mode or a differential inputs mode.

4. The converter of claim 1, comprising a selection circuit with three configuration modes including a differential inputs mode, an INP single-end input mode, and an INN single-end input mode, wherein for the differential inputs mode, both DACs and common-mode switches are enabled, wherein for the INN single-end input configuration, DAC_P and the corresponding capacitors are disabled, and wherein for the INP single-end input configuration, DAC_N and the associated capacitors are disabled.

5. The converter of claim 4, for differential inputs mode, both DACs are enabled, at the end of the first binary search operation, the comparator input VP/VN voltage is expressed as:

$$VP = VCM + \frac{(VR - INP)}{2} + \frac{(0 - INP)}{2}$$

$$VN = VCM + \frac{(0 - INN)}{2} + \frac{(VR - INN)}{2}$$

wherein VCM is common-mode voltage, $V_R$ is the reference voltage, INP/INN are differential input voltages.

6. The converter of claim 4, for the INP single-end input mode, a DAC_N is disabled, at the end of the first binary search operation, and the comparator input VP/VN voltage is expressed as:

$$VP = VCM + \frac{(VR - INP)}{2} + \frac{(0 - INP)}{2}$$

$$VN = VCM$$

wherein VCM is common-mode voltage, $V_R$ is the reference voltage, INP is single-end input voltage.

7. The converter of claim 4, for the INN single-end input mode, wherein DAC_P is disabled, at the end of the first binary search operation, the comparator input VP/VN voltage is expressed as:

$$VP = VCM$$

$$VN = VCM + \frac{(VR - INN)}{2} + \frac{(0 - INN)}{2}$$

wherein VCM is common-mode voltage, $V_R$ is the reference voltage, INN is single-end input voltage.

8. The converter of claim 1, wherein the LSB voltage and the output code range remain consistent whether in differential input mode, INP single-end input mode, or INN single-end input mode.

9. The converter of claim 1, wherein the input common-mode variation of the comparator during binary search phase is reduced when using single-ended input configuration.

10. The converter of claim 1, for the single-end input mode, one DAC is disabled to reduce consumption of SARADC.

11. A method of digitizing an analog input, comprising: configuring a differential Successive Approximation Register Analog-to-Digital (SARADC) for single-ended input with an LSB voltage; maintaining an output code range constant, wherein the SARADC includes input switches, capacitive Digital-to-Analog (DAC), a comparator, binary search logic and single-end P/N configure circuit; the binary search logic is coupled to single-end P/N configure circuit which controls DAC switches and common-mode switches.

12. The method of claim 11, comprising beginning each conversion with an input sampling phase followed by a binary search phase and during the input sampling phase, the input voltage is captured onto the sampling capacitors and during the binary search phase, capacitive DAC switches are sequentially coupled to reference or ground based on the outputs of the comparator and single-end P/N configure circuit and the conversion is complete when all the DAC capacitors have been exercised through the binary search phase.

13. The method of claim 11, comprising controlling the capacitive DAC switches and common-mode voltage (VCM) switches by the single-end P/N configure circuit, wherein the switches are connected to the reference, ground or common-mode voltage (VCM) depending on an input configuration to select an INP selected single-end input, an INN selected single-end input, or a differential inputs mode.

14. The method of claim 11, comprising selecting one of three configuration modes including differential inputs, INP single-end input, and INN single-end input, wherein for the differential inputs mode, both DACs and common-mode switches are enabled, for the INN single-end input mode, DAC_P and the corresponding capacitors are disabled, and for INP single-end input mode, DAC_N and the associated capacitors are disabled.

15. The method of claim 14, for differential inputs configuration, enabling both DACs, and at the end of the first binary search operation, the comparator input VP/VN voltage is expressed as:

$$VP = VCM + \frac{(VR - INP)}{2} + \frac{(0 - INP)}{2}$$
$$VN = VCM + \frac{(0 - INN)}{2} + \frac{(VR - INN)}{2}$$

wherein VCM is common-mode voltage, $V_R$ is the reference voltage, INP/INN are differential input voltages.

16. The method of claim 14, for INP single-end input configuration, disabling DAC_N, and at the end of the first binary search operation, the comparator input VP/VN voltage is expressed as:

$$VP = VCM + \frac{(VR - INP)}{2} + \frac{(0 - INP)}{2}$$
$$VN = VCM$$

wherein VCM is common-mode voltage, $V_R$ is the reference voltage, INP is single-end input voltage.

17. The method of claim 14, for INN single-end input configuration, comprising disabling DAC_P, and at the end of the first binary search operation, the comparator input VP/VN voltage is expressed as:

$$VP = VCM$$
$$VN = VCM + \frac{(VR - INN)}{2} + \frac{(0 - INN)}{2}$$

wherein VCM is common-mode voltage, $V_R$ is the reference voltage, INN is single-end input voltage.

18. The method of claim 11, comprising maintaining the LSB voltage and the output code range consistent whether in differential input mode, INP single-end input mode, or INN single-end input mode.

19. The method of claim 11, wherein the input common-mode variation of the comparator during binary search phase is reduced when using single-ended input configuration.

20. The method of claim 11, for single-end input configuration, comprising disabling one DAC to reduce power consumption.

* * * * *